United States Patent [19]
Lenz

[11] Patent Number: 5,998,932
[45] Date of Patent: Dec. 7, 1999

[54] FOCUS RING ARRANGEMENT FOR SUBSTANTIALLY ELIMINATING UNCONFINED PLASMA IN A PLASMA PROCESSING CHAMBER

[75] Inventor: Eric H. Lenz, San Jose, Calif.

[73] Assignee: Lam Research Corporation, Fremont, Calif.

[21] Appl. No.: 09/105,547

[22] Filed: Jun. 26, 1998

[51] Int. Cl.[6] ..................................................... H05H 1/02
[52] U.S. Cl. ..................... 315/111.21; 361/234; 118/728
[58] Field of Search ...................... 315/111.21; 118/728; 156/345 PW; 361/234

[56] References Cited

U.S. PATENT DOCUMENTS

| | | | |
|---|---|---|---|
| 5,534,751 | 7/1996 | Lenz et al. | 315/111.71 |
| 5,569,356 | 10/1996 | Lenz et al. | 156/345 PW X |
| 5,589,003 | 12/1996 | Zhao et al. | 118/728 |
| 5,868,848 | 2/1999 | Tsukamoto | 156/345 X |
| 5,891,348 | 4/1999 | Ye et al. | 118/723 R X |

*Primary Examiner*—Justin P. Bettendorf
*Attorney, Agent, or Firm*—Beyer & Weaver, LLP

[57] ABSTRACT

A focus ring assembly configured to substantially encircle a chuck of a plasma processing chamber. The focus ring assembly includes an annular dielectric body; and an electrically conductive shield surrounding the annular dielectric body. The electrically conductive shield is configured to be electrically grounded within the plasma processing chamber and includes a tube-shaped portion being disposed outside of the annular dielectric body and surrounding at least part of the annular dielectric body. The electrically conductive shield further includes an inwardly-protruding flange portion being in electrical contact with the tube-shaped portion. The flange portion forms a plane that intersects the tube-shaped portion. The flange portion is embedded within the annular dielectric body.

22 Claims, 4 Drawing Sheets

5,998,932

FOCUS RING ARRANGEMENT FOR SUBSTANTIALLY ELIMINATING UNCONFINED PLASMA IN A PLASMA PROCESSING CHAMBER

BACKGROUND OF THE INVENTION

The present invention relates to the manufacture of semiconductor-based products. More particularly, the present invention relates to improved techniques for controlling plasma formation in a plasma processing chamber.

The use of plasma-enhanced processes in the manufacture of semiconductor-based products (such as integrated circuits or flat panel displays) is well known. Generally speaking, plasma-enhanced processes involve the processing of a substrate (e.g., a glass panel or a semiconductor wafer) in a plasma processing chamber. Within the plasma processing chamber, a plasma may be ignited out of appropriate etchant or deposition source gases to respectively etch or deposit a layer of material on the surface of the substrate.

To facilitate discussion, FIG. 1 depicts a capacitively-coupled plasma processing chamber 100, representing an exemplary plasma processing chamber of the types typically employed to etch a substrate. Referring now to FIG. 1, there is shown a chuck 104, representing the workpiece holder on which a substrate 106 is positioned during etching. Chuck 104 may be implemented by any suitable chucking technique, e.g., electrostatic, mechanical, clamping, vacuum, or the like. During etching, chuck 104 is typically supplied with RF power having a frequency of, for example, about 2 MHz to about 27 Mhz, by an RF power supply 110. In some systems, chuck 104 may be supplied with dual frequencies, e.g., 2 MHz and 27 MHz simultaneously during etching.

Above substrate 106, there is disposed a reactor top 112, which is formed of a conductive material such as aluminum. Confinement rings 102 may be coupled in a fixed manner to reactor top 112 or may be coupled to cam-based plungers (not shown in FIG. 1) that allow confinement rings 102 to be raised and lowered without moving reactor top 112. Further details pertaining to the cam-based arrangement may be found in a co-pending U.S. patent application Ser. No. 09/104,158 entitled "Cam-based Arrangement for Positioning Confinement Rings in a Plasma Processing Chamber," filed on even date by inventor Eric H. Lenz (Attorney Docket No. P398/LAM1P088) and incorporated by reference herein.

In general, confinement rings 102 help confine the etching plasma to the region above substrate 106 to improve process control and to ensure repeatability. Although only two confinement rings are shown in the example of FIG. 1, it should be understood that any number of confinement rings may be provided. Confinement rings and their function may be better understood by reference to commonly assigned U.S. Pat. No. 5,534,751, which is incorporated by reference herein.

Also coupled to reactor top 112 are an upper electrode 114 and a baffle 116. Upper electrode 114 may be grounded (as in the case of FIG. 1) or may be powered by another RF power source 120 during etching. If upper electrode 114 is powered, it may be insulated from the remainder of the reactor to isolate the electrode from ground. During etching, plasma is formed from etchant source gas supplied via a gas line 122 and baffle 116.

When RF power is supplied to chuck 104 (from radio frequency generator 110), equipotential field lines are set up over substrate 106. During plasma processing, the positive ions accelerate across the equipotential field lines to impinge on the surface of substrate 106, thereby providing the desired etch effect (such as improving etch directionality). Due to geometry factors, however, the field lines may not be uniform across the substrate surface and may vary significantly at the edge of substrate 106. Accordingly, a focus ring is typically provided to improve process uniformity across the entire substrate surface. With reference to FIG. 1, chuck 104 is shown disposed within a focus ring 108, which is typically formed of a suitable dielectric material such as ceramic, quartz, or plastic.

The equipotential field lines that are set up during plasma etching may be seen more clearly in FIG. 2. In FIG. 2, the presence of focus ring 108 allow the equipotential field lines to be disposed substantially uniformly over the entire surface of the substrate, thereby allowing etching to proceed in a uniform manner across the substrate. As seen by FIG. 2, however, some of the equipotential field lines also extend into the region 160 outside of focus ring 108. The presence of the equipotential field lines in region 160 may cause any charged particles that leak past the confinement rings to accelerate in a direction perpendicular to the equipotential field lines toward the chamber walls. This acceleration and the subsequent collision between the charged particles and the chamber walls may generate secondary electrons, which may ignite and/or sustain unconfined plasma in region 160 (i.e., unintended plasma that is not confined to region directly above the substrate).

The inadvertent generation of plasma in region 160 renders the etch process difficult to control and may damage components within this region. By way of example, this unconfined plasma, which may be unplanned and/or intermittent, changes the amount of power absorbed by the plasma within the plasma processing chamber, thereby making it difficult to control the delivery of power to the chuck to achieve consistent, repeatable etch results. As another example, the presence of unwanted plasma in region 160 may cause damage to the chamber door, particularly to the seals that are provided therewith. The chamber door is necessary for substrate transport into and out of the chamber, and if the seals are damaged, accurate control of the chamber pressure may be difficult. When the seals and/or other components in region 160 are inadvertently attacked by the plasma, particulate and/or polymeric contaminants may form along the chamber walls, potentially leading to contamination of the etch environment.

In view of the foregoing, there are desired techniques for minimizing and/or eliminating the unwanted plasma formation in the region outside of the focus ring of the plasma processing chamber.

SUMMARY OF THE INVENTION

The invention relates, in one embodiment, to a focus ring assembly configured to substantially encircle a chuck of a plasma processing chamber. The focus ring assembly includes an annular dielectric body; and an electrically conductive shield surrounding the annular dielectric body. The electrically conductive shield is configured to be electrically grounded within the plasma processing chamber and includes a tube-shaped portion being disposed outside of the annular dielectric body and surrounding at least part of the annular dielectric body. The electrically conductive shield further includes an inwardly-protruding flange portion being in electrical contact with the tube-shaped portion. The flange portion forms a plane that intersects the tube-shaped portion. The flange portion is embedded within the annular dielectric body.

In another embodiment, the invention relates to a plasma processing chamber configured to process a substrate. The plasma processing system includes a chuck configured to support the substrate during plasma processing. There is further included a focus ring assembly substantially encircling the chuck. The focus ring assembly includes an annular dielectric body and an electrically conductive shield surrounding the annular dielectric body. The electrically conductive shield is configured to be electrically grounded within the plasma processing chamber. The electrically conductive shield includes a tube-shaped portion being disposed outside of the annular dielectric body and surrounding at least part of the annular dielectric body. The electrically conductive shield further includes an inwardly-protruding flange portion being in electrical contact with the tube-shaped portion. The flange portion forms a plane that intersects the tube-shaped portion. The flange portion is embedded within the annular dielectric body.

In yet another embodiment, the invention relates to a method for forming a focus ring assembly of a plasma processing chamber. The focus ring assembly is configured to substantially encircle a chuck of the plasma processing chamber. The method includes providing an annular dielectric body and surrounding the annular dielectric body with an electrically conductive shield, which includes surrounding at least part of the annular dielectric body with a tube-shaped portion of the electrically conductive shield. The tube-shaped portion is disposed outside of the annular dielectric body. The surrounding the annular dielectric body with an electrically conductive shield includes embedding an inwardly-protruding flange portion of the electrically conductive shield within the annular dielectric body. The inwardly-protruding flange portion is in electrical contact with the tube-shaped portion. The flange portion forms a plane that intersects the tube-shaped portion.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings, which are not drawn to scale to simplify the illustration and in which like reference numerals refer to similar elements.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In accordance with one aspect of the present invention, process control is substantially improved by reducing or eliminating the unconfined plasma (i.e., the unwanted plasma that is inadvertently ignited and/or sustained outside of the focus ring). As the term is employed herein, the region outside of the focus ring refers to annular region of the plasma processing chamber which is external to the column of space whose outer periphery is defined by the circumference of the focus ring. The plasma is preferably confirmed within this column of space. Outside of the focus ring, the electric field is preferably reduced to the point where plasma can no longer be sustained. By eliminating the unconfined plasma, the amount of power absorbed by the etching plasma that is disposed above the substrate may be more consistent from substrate to substrate, thereby rendering the etch repeatable. The elimination of the unconfined plasma also helps reduce the corrosion or break down of components disposed in the region outside of the focus ring (e.g., door seals).

In accordance with one embodiment of the present invention, there is provided a focus ring assembly, including a grounded conductive shield which is configured to concentrate the equipotential field lines in the focus ring body. The grounded conductive shield preferably includes two portions: a tube-shaped portion which surrounds at least a part of the dielectric focus ring body and an inwardly-protruding flange portion which is embedded within the dielectric focus ring body itself. It is believed that this configuration substantially reduces the density of equipotential field lines in the region outside of the focus ring. By substantially reducing the density of equipotential field lines in the near-vacuum region outside of the focus ring, the amount of energy acquired by any charged particle that leaks into this area is substantially reduced, thereby essentially eliminating the possibility of plasma ignition and/or sustenance.

Figure 1:
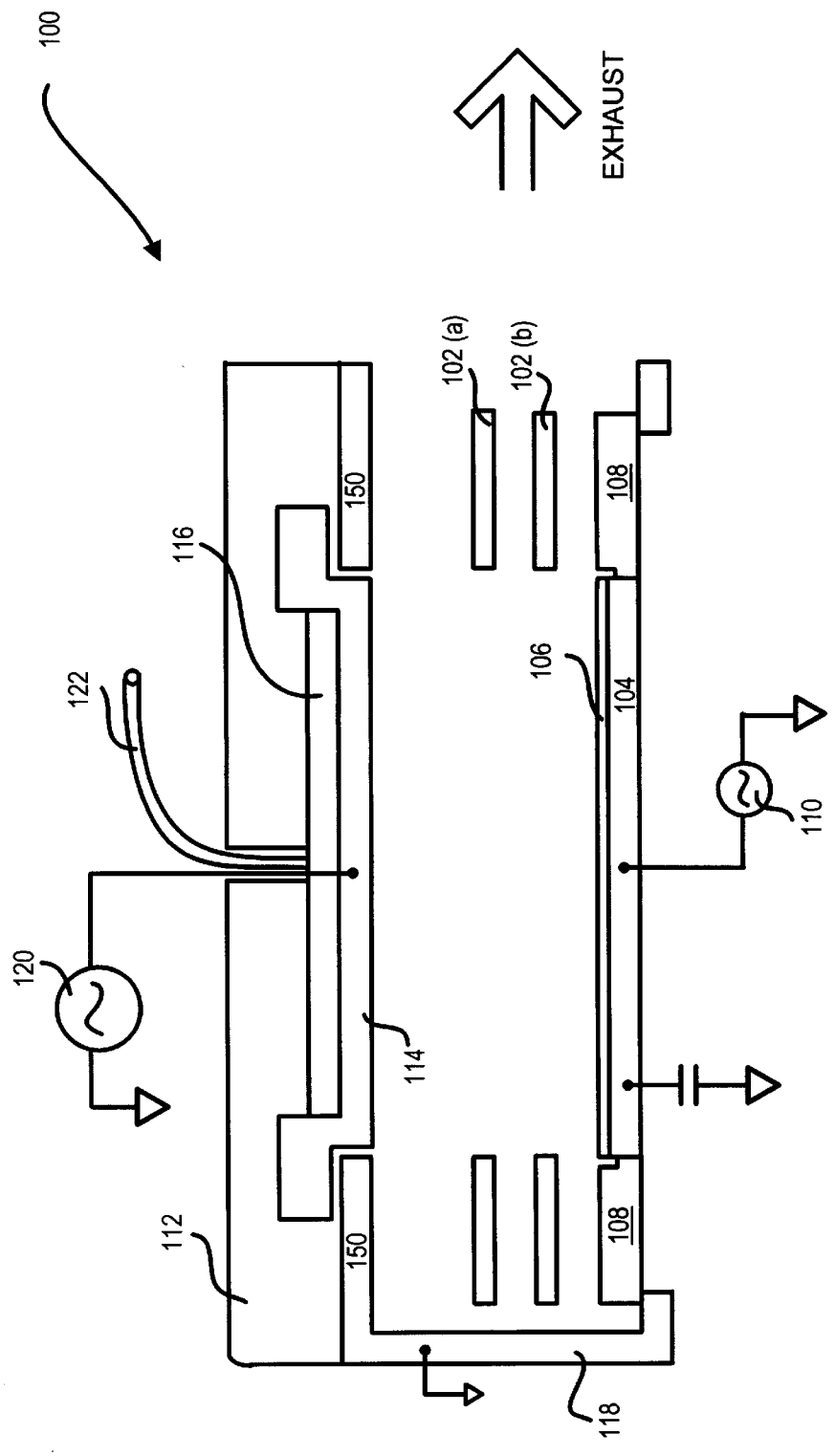
FIG. 1 illustrates a typical capacitively coupled plasma processing chamber.
Figure 2:
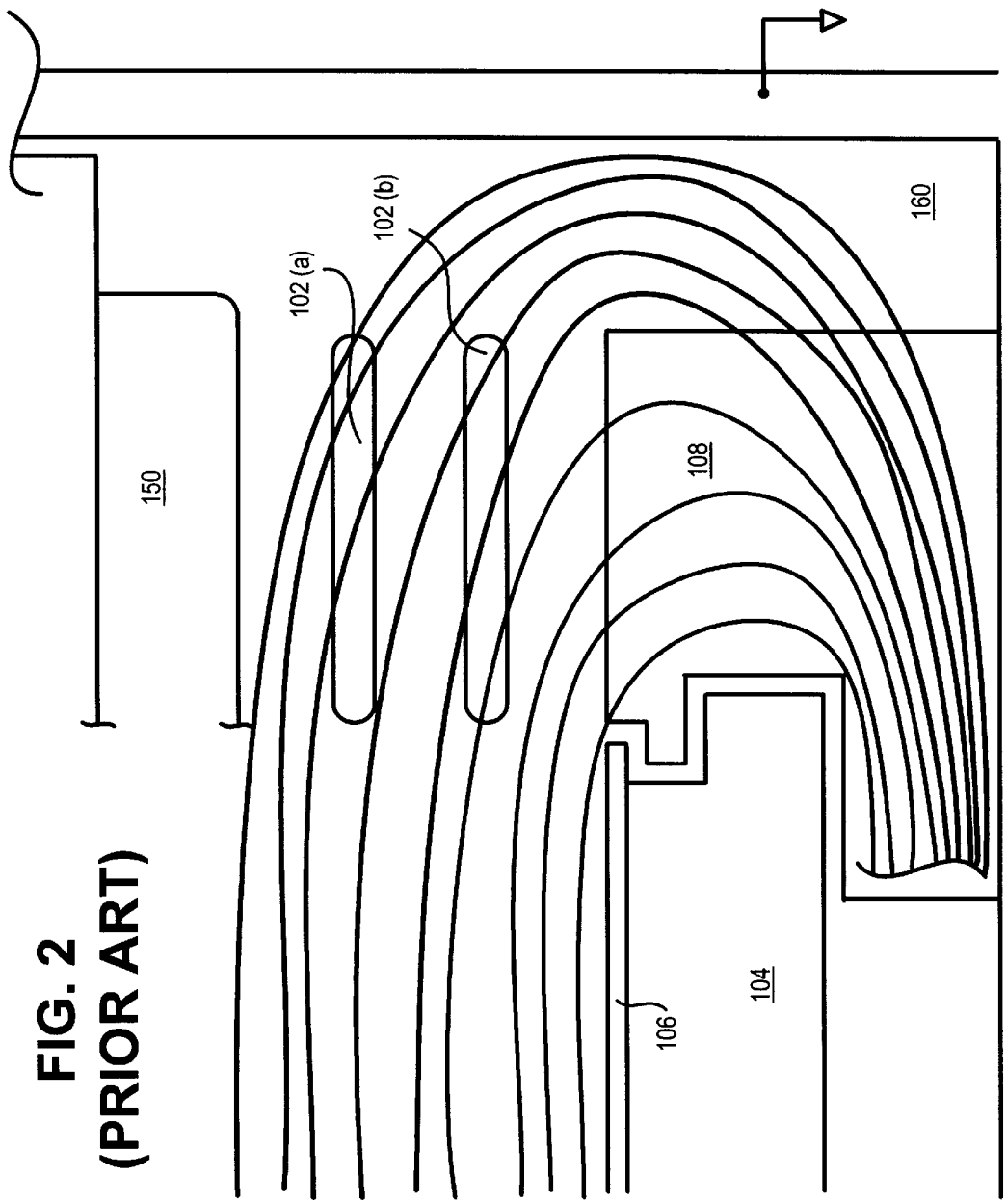
FIG. 2 illustrates the equipotential field lines that may be formed in the plasma processing chamber of FIG. 1 during plasma processing.
Figure 3:
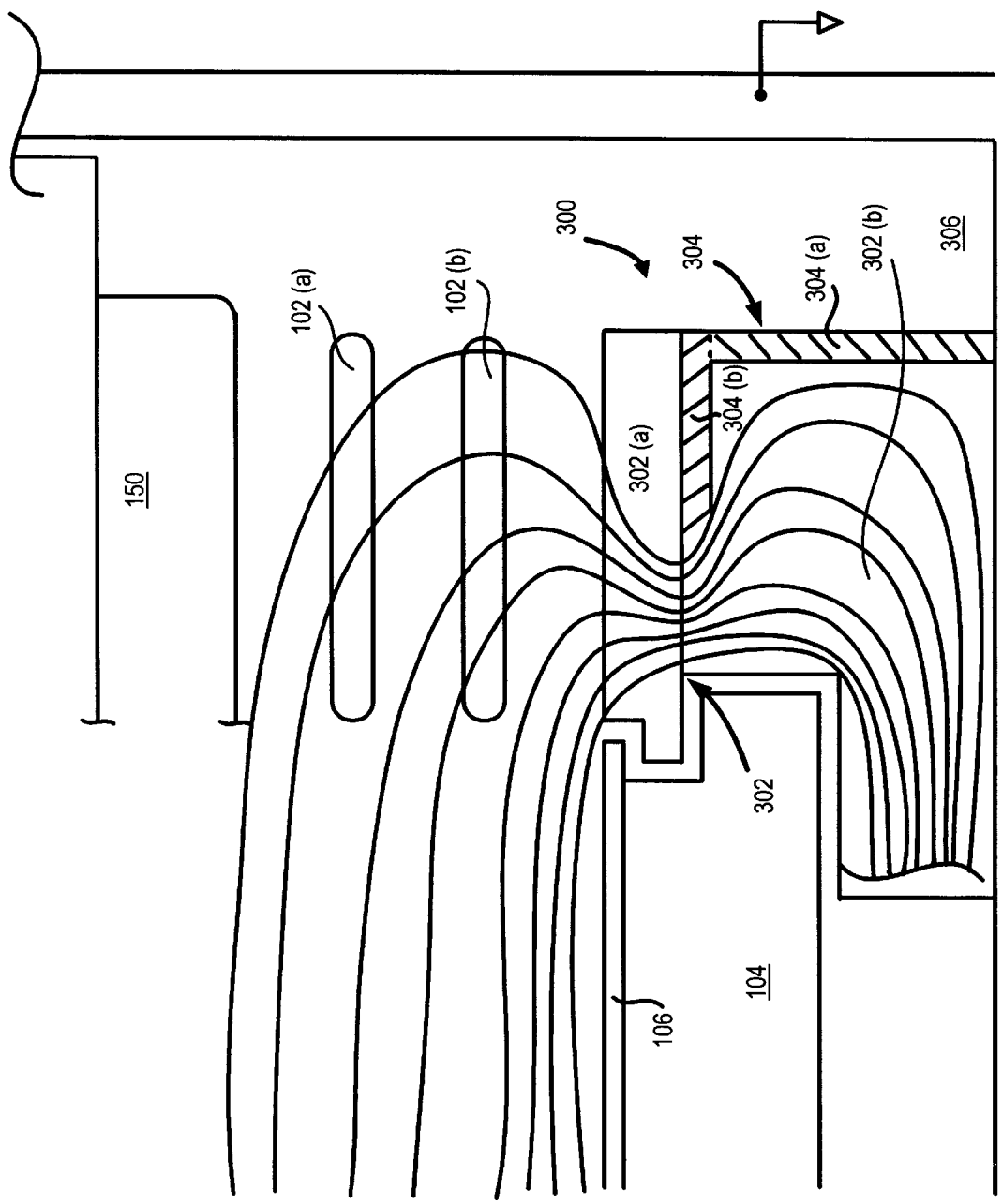
FIG. 3 illustrates, in accordance with one embodiment of the present invention, the inventive focus ring assembly, including a grounded electrically conductive shield having both a tube-shaped portion and an inwardly-protruding flange portion.

The features and advantages of the present invention may be better understood with reference to the figures that follow. FIG. 3 illustrates a relevant portion of the plasma processing chamber of FIG. 1, including a focus ring assembly 300. As shown in FIG. 3, focus ring assembly 300 includes an annular dielectric body 302 (including both portions 302(a) and 302(b)), which encircles chuck 104 when viewed from above. Annular dielectric body 302 may be formed of a suitable dielectric material such as quartz, alumina, silicon nitride, or a plastic material such as TEFLON™, polyimid, polyetheretherketone (PEEK), polyamid, polyimidamid, VESPEL™ or the like.

As will be discussed later herein, annular dielectric body 302 may also be a composite structure that may include two or more different portions, each of which may be formed of a different dielectric material.

Focus ring assembly 300 also includes an electrically conductive shield 304, which comprises a tube-shaped portion 304(a) and an inwardly-protruding portion 304(b), which is in electrical contact with tube-shaped portion 304(a). As seen in FIG. 3, tube-shaped portion 304(a) substantially surrounds and shields the lower portion of annular dielectric body 302 while inwardly-protruding portion 304(b) is embedded within annular dielectric body 302 itself. It is believed that the presence of inwardly-protruding portion 304(b), which is grounded during operation, substantially reduces the density of the equipotential field lines in the upper portion of annular region 306, i.e., the region outside of the focus ring.

While not wishing to be bound by theory, it is believed that inwardly-protruding portion 304(b) forces the equipotential lines to curve sharply away from region 306 in order to stay in between high voltage chuck 104 and the ground potential, which is present on electrically conductive shield 304 during operation. If inwardly-protruding portion 304(b) were absent from the electrically conductive shield, it is believed that some of the equipotential field lines may extend into region 306, particularly into the upper portion of region 306, to energize ions in region 306 and possibly ignite new plasma or sustain plasma already existing therein.

Figure 4:
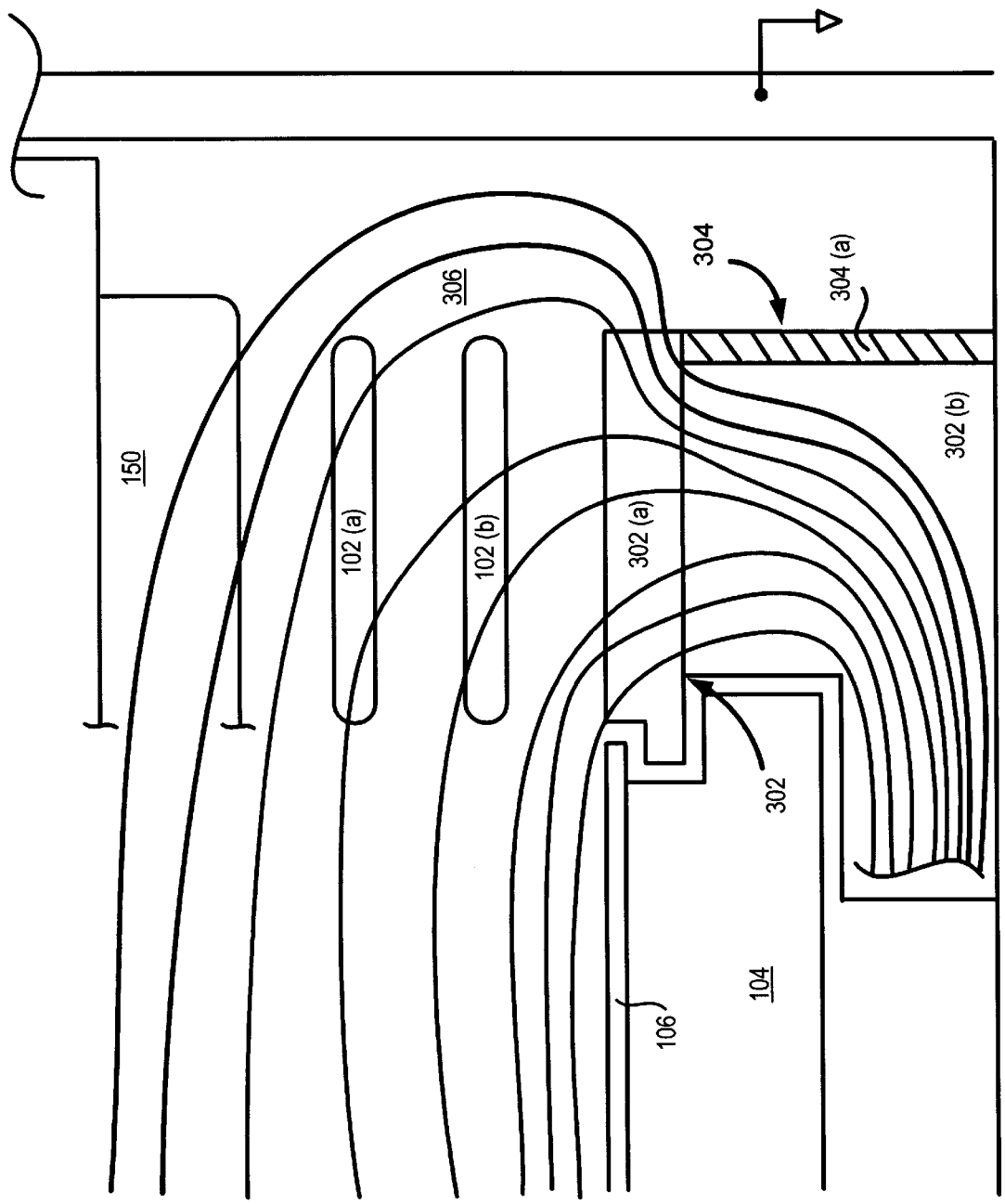
FIG. 4 illustrates the field lines that may be formed when the inwardly-protruding flange portion of the grounded electrically conductive shield is omitted.

With reference to FIG. 4, for example, the electrically conductive shield is shown having only a tube-shaped portion (i.e., without an inwardly-protruding portion). In FIG. 4, some of the field lines are shown extending into the upper portion of region 306. Because of this, there is potentially sufficient electric field density in this region to ignite and/or sustain the unwanted plasma.

Note that it is disadvantageous to extend the tube-shaped portion upward beyond the upper surface of the annular dielectric body of focus ring 302 since the presence of a physical structure, such as an extended tube-shaped conductive shield, in the upper portion of region 306 may impede substrate transport and/or byproduct exhaust. While it is possible that some arrangement may be provided to move such an extended conductive shield out of the way for substrate transport, the additional complexity and expenses involved therewith would have been undesirable. Also, such an extended conductive shield may be corroded by undue contact with the plasma byproducts.

It should be appreciated that it may also be disadvantageous and/or impractical to fill up a portion or all of region 306 with a dielectric material simply for the purpose of minimizing or eliminating the near-vacuum region in which plasma may be formed. At least a portion of region 306 may, in any case, need to remain unobstructed to serve as part of the exhaust path through which the etch byproducts may be pumped away. Accordingly, the use of the inwardly-protruding flange portion (as is done in the embodiment of FIG. 3) to force the equipotential field lines to curve sharply away from region 306 advantageously reduces and/or eliminates unconfined plasma formation without the disadvantages associated with extending the tube-shaped portion into the upper portion of region 306 (which may block the substrate transport path or the exhaust path) or without the disadvantages associated with filling region 306 (which interferes with the exhaust operation).

Although inwardly-protruding flange portion 304(b) is shown forming a 90° angle with the longitudinal axis of tube-shaped portion 304(a) of the electrically conductive shield in FIG. 3, the exact angle at which these two portions intersect is not critical. Likewise, even though inwardly-protruding flange portion 304(b) is shown connected to the upper edge of tube-shaped portion 304(a), it is contemplated that this connection may be made lower or higher relative to the upper edge of tube-shaped portion 304(a). Also, the exact depth of penetration of inwardly-protruding flange portion 304(b) into the body of the focus ring may also vary from system to system. It is of course preferable that the inwardly-protruding flange portion 304(b) protrudes sufficiently into the body of the focus ring to bend a sufficient number of equipotential field lines away from region 306 and reduce the electric field density in this region to a sufficiently low level such that unconfined plasma cannot be ignited and/or sustained.

Additionally, although inwardly-protruding flange portion 304(b) is shown integrally formed with tube-shaped portion 304(a) in FIG. 3, such is not absolutely necessary. For example, it is contemplated that inwardly-protruding flange portion 304(b) may be a separately formed electrically conductive piece that is in electrical contact with tube-shaped portion 304(a) and ground. As such, inwardly-protruding flange portion 304(b) would also serve its purpose of bending the equipotential field lines sharply away from region 306 so that unconfined plasma in this region cannot be formed and/or sustained.

In FIG. 3, tube-shaped portion 304(a) is shown disposed outside of the annular dielectric body of the focus ring. By spacing the tube-shaped portion 304 (a) (which is grounded during operation) as far away from high voltage chuck 104 as possible, arcing across the gap between the high voltage chuck and the inner surface of the focus ring is substantially minimized, which advantageously prolongs the life of the focus ring and/or the high voltage chuck.

In one optional embodiment, annular dielectric body 302 may represent a composite structure, which includes two or more different portions. With reference to FIG. 3, for example, this refinement is shown by the presence of both first annular dielectric portion 302(a) and second annular dielectric portion 302(b). First annular dielectric portion 302(a) may be formed of, for example, a ceramic material to maximize resistance to the etching effects of the plasma and to provide structural rigidity and stability with changing temperature. It is contemplated, however, that first annular dielectric portion 302(a) may be formed of any suitable dielectric material such as quartz, alumina, silicon nitride, or a plastic material such as polyimid, polyetheretherketone (PEEK), polyamid, polyimidamid, VESPEL™ or the like.

Second annular dielectric portion 302(b) may be formed of, for example, a plastic material such as Teflon™, which is closer in dielectric constant to vacuum than the dielectric material of first annular dielectric portion 302(a). It is contemplated, however, that first annular dielectric portion 302(a) may also be formed of any suitable dielectric material such as quartz, alumina, silicon nitride, or a plastic material such as polyimid, polyetheretherketone (PEEK), polyamid, polyimidamid, VESPEL™ or the like. In any case, the use of a dielectric material that has a dielectric constant close to the dielectric constant of vacuum for second annular dielectric portion 302(b) advantageously reduces electrical stress within the focus ring arrangement.

To elaborate, electrical stress may be created if second annular dielectric portion 302(b) is formed of a material having a high dielectric constant, and there is a small vacuum gap between tube-shaped portion 304(a) and second annular dielectric portion 302(b) (due to, for example, manufacturing tolerance) since most of the field lines would be concentrated in the small vacuum gap. By using a material having a dielectric constant close to the dielectric constant of vacuum for second annular dielectric portion 302(b), the field lines are more equally spread throughout the thickness between tube-shaped portion 304(a) and the inner wall of second annular dielectric portion 302(b), which helps reduce electrical stress and prolong the useful life of the focus ring arrangement.

By forming the annular dielectric body in two or more separate portions, the embedding of inwardly-protruding flange portion 304(*b*) into the annular dielectric body is also simplified. By way of example, such embedding may be accomplished simply by inserting the inwardly-protruding flange portion into the space between first annular dielectric portion 302(*a*) and second annular dielectric portion 302(*b*) of FIG. 3. Accordingly, it is not necessary to mold the annular dielectric body around the electrically conductive shield in order to embed the inwardly-protruding flange portion into the annular dielectric body. Further, if adjustments need to be made to the position of the annular dielectric body relative to the chuck (in order to calibrate a system, for example), the use of a multi-portion annular dielectric body also helps simplify the adjustment. By way of example, adjustment may be made simply by raising or lowering first annular dielectric portion 302(*a*) without disturbing the rest of the focus ring arrangement.

While this invention has been described in terms of several preferred embodiments, there are alterations, permutations, and equivalents which fall within the scope of this invention. By way of example, although the plasma processing system employed to illustrate the invention utilizes confinement rings, those confinement rings are not absolutely required. Although the presence of the confinement rings helps in reducing the amount of charged ions leaked outside of the region immediately above the substrate, the use of the inventive focus ring arrangement, which includes a conductive ground shield having an inwardly-protruding flange, also advantageously reduces unconfined plasma formation and/or sustenance even when confinement rings are not provided. Further, although a capacitively coupled plasma processing chamber is employed herein to facilitate discussion of the preferred embodiment, it is contemplated that the inventive focus ring assembly may also be beneficial to etch processes performed in other types of plasma processing systems (e.g., inductively coupled plasma processing systems, ECR-based systems, MORI source-based systems, and the like). It should also be noted that there are may alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A focus ring assembly configured to substantially encircle a chuck of a plasma processing chamber, comprising:

an annular dielectric body; and an electrically conductive shield surrounding said annular dielectric body, said electrically conductive shield being configured to be electrically grounded within said plasma processing chamber, said electrically conductive shield including a tube-shaped portion being disposed outside of said annular dielectric body and surrounding at least part of said annular dielectric body, and an inwardly-protruding flange portion being in electrical contact with said tube-shaped portion, said flange portion forming a plane that intersects said tube-shaped portion, said flange portion being embedded within said annular dielectric body.

2. The focus ring assembly of claim 1 wherein said plane intersects said tube-shaped portion at an upper edge of said tube-shaped portion, said upper edge of said tube-shaped portion being positioned in between an upper surface of said annular dielectric body and a lower surface of said annular dielectric body.

3. The focus ring assembly of claim 1 wherein said plane forms a 90° angle with a longitudinal axis of said tube-shaped portion.

4. A focus ring assembly configured to substantially encircle a chuck of a plasma processing chamber, comprising:

an annular dielectric body; and an electrically conductive shield surrounding said annular dielectric body, said electrically conductive shield being configured to be electrically grounded within said plasma processing chamber, said electrically conductive shield including a tube-shaped portion being disposed outside of said annular dielectric body and surrounding at least part of said annular dielectric body, and an inwardly-protruding flange portion being in electrical contact with said tube-shaped portion, said flange portion forming a plane that intersects said tube-shaped portion, said flange portion being embedded within said annular dielectric body, wherein said annular dielectric body is formed of a first annular portion and a second annular portion adjacent said first annular portion, at least a portion of said second annular portion being surrounded by said tube-shaped portion of said electrically conductive shield, said first annular portion is formed of a first dielectric material, said second annular portion is formed of a second dielectric material different from said first dielectric material.

5. The focus ring assembly of claim 4 wherein said first dielectric material has a first dielectric constant, said second dielectric constant has a second dielectric constant closer to a dielectric constant of vacuum than said first dielectric constant.

6. The focus ring assembly of claim 5 wherein said first dielectric material is ceramic.

7. The focus ring assembly of claim 5 wherein said second dielectric material is plastic.

8. A plasma processing chamber configured to process a substrate, comprising:

a chuck configured to support said substrate during plasma processing; and a focus ring assembly substantially encircling said chuck, said focus ring assembly including:

an annular dielectric body; and an electrically conductive shield surrounding said annular dielectric body, said electrically conductive shield being configured to be electrically grounded within said plasma processing chamber, said electrically conductive shield including a tube-shaped portion being disposed outside of said annular dielectric body and surrounding at least part of said annular dielectric body, and an inwardly-protruding flange portion being in electrical contact with said tube-shaped portion, said flange portion forming a plane that intersects said tube-shaped portion, said flange portion being embedded within said annular dielectric body.

9. The plasma processing chamber of claim 8 wherein said plane intersects said tube-shaped portion at an upper edge of said tube-shaped portion, said upper edge of said tube-shaped portion being positioned in between an upper surface of said annular dielectric body and a lower surface of said annular dielectric body.

10. The plasma processing chamber of claim 8 wherein said plane forms a 90° angle with a longitudinal axis of said tube-shaped portion.

11. A plasma processing chamber configured to process a substrate, comprising:

a chuck configured to support said substrate during plasma processing; and a focus ring assembly substantially encircling said chuck, said focus ring assembly including:

an annular dielectric body; and an electrically conductive shield surrounding said annular dielectric body, said electrically conductive shield being configured to be electrically grounded within said plasma processing chamber, said electrically conductive shield including a tube-shaped portion being disposed outside of said annular dielectric body and surrounding at least part of said annular dielectric body, and an inwardly-protruding flange portion being in electrical contact with said tube-shaped portion, said flange portion forming a plane that intersects said tube-shaped portion, said flange portion being embedded within said annular dielectric body, wherein said annular dielectric body is formed of a first annular portion and a second annular portion adjacent said first annular portion, at least a portion of said second annular portion being surrounded by said tube-shaped portion of said electrically conductive shield, said first annular portion is formed of a first dielectric material, said second annular portion is formed of a second dielectric material different from said first dielectric material.

12. The plasma processing chamber of claim 11 wherein said first dielectric material has a first dielectric constant, said second dielectric constant has a second dielectric constant closer to a dielectric constant of vacuum than said first dielectric constant.

13. The plasma processing chamber of claim 12 wherein said first dielectric material is ceramic.

14. The plasma processing chamber of claim 12 wherein said second dielectric material is plastic.

15. The plasma processing chamber of claim 8 further comprising a confinement ring disposed above said focus ring assembly.

16. A method for forming a focus ring assembly of a plasma processing chamber, said focus ring assembly being configured to substantially encircle a chuck of said plasma processing chamber, comprising:

providing an annular dielectric body; and surrounding said annular dielectric body with an electrically conductive shield, including surrounding at least part of said annular dielectric body with a tube-shaped portion of said electrically conductive shield, said tube-shaped portion being disposed outside of said annular dielectric body, and embedding an inwardly-protruding flange portion of said electrically conductive shield within said annular dielectric body, said inwardly-protruding flange portion being in electrical contact with said tube-shaped portion, said flange portion forming a plane that intersects said tube-shaped portion.

17. The method of claim 16 wherein said plane intersects said tube-shaped portion at an upper edge of said tube-shaped portion, said upper edge of said tube-shaped portion being positioned in between an upper surface of said annular dielectric body and a lower surface of said annular dielectric body.

18. The method of claim 16 wherein said plane forms a 90° angle with a longitudinal axis of said tube-shaped portion.

19. A method for forming a focus ring assembly of a plasma processing chamber, said focus ring assembly being configured to substantially encircle a chuck of said plasma processing chamber, comprising:

providing an annular dielectric body; and surrounding said annular dielectric body with an electrically conductive shield, including surrounding at least part of said annular dielectric body with a tube-shaped portion of said electrically conductive shield, said tube-shaped portion being disposed outside of said annular dielectric body, and embedding an inwardly-protruding flange portion of said electrically conductive shield within said annular dielectric body, said inwardly-protruding flange portion being in electrical contact with said tube-shaped portion, said flange portion forming a plane that intersects said tube-shaped portion, wherein said annular dielectric body is formed of a first annular portion and a second annular portion adjacent said first annular portion, at least a portion of said second annular portion being surrounded by said tube-shaped portion of said electrically conductive shield, said first annular portion is formed of a first dielectric material, said second annular portion is formed of a second dielectric material different from said first dielectric material.

20. The method of claim 19 wherein said first dielectric material has a first dielectric constant, said second dielectric constant has a second dielectric constant closer to a dielectric constant of vacuum than said first dielectric constant.

21. The method of claim 20 wherein said first dielectric material is ceramic.

22. The method of claim 20 wherein said second dielectric material is plastic.

* * * * *

(12) EX PARTE REEXAMINATION CERTIFICATE (9449th)
United States Patent
Lenz

(10) Number: US 5,998,932 C1
(45) Certificate Issued: Dec. 19, 2012

(54) FOCUS RING ARRANGEMENT FOR SUBSTANTIALLY ELIMINATING UNCONFINED PLASMA IN A PLASMA PROCESSING CHAMBER

(75) Inventor: Eric H. Lenz, San Jose, CA (US)

(73) Assignee: Lam Research Corporation, Fremont, CA (US)

Reexamination Request:
No. 90/012,031, Dec. 17, 2011

Reexamination Certificate for:
Patent No.: 5,998,932
Issued: Dec. 7, 1999
Appl. No.: 09/105,547
Filed: Jun. 26, 1998

(51) Int. Cl.
*H01J 7/24* (2006.01)
*H05B 31/26* (2006.01)
*C23C 16/00* (2006.01)
*H01L 21/683* (2006.01)
*H01T 23/00* (2006.01)

(52) U.S. Cl. .................... 315/111.21; 118/728; 361/234

(58) Field of Classification Search .................. None
See application file for complete search history.

(56) References Cited

To view the complete listing of prior art documents cited during the proceeding for Reexamination Control Number 90/012,031, please refer to the USPTO's public Patent Application Information Retrieval (PAIR) system under the Display References tab.

*Primary Examiner* — Robert Nasser

(57) ABSTRACT

A focus ring assembly configured to substantially encircle a chuck of a plasma processing chamber. The focus ring assembly includes an annular dielectric body; and an electrically conductive shield surrounding the annular dielectric body. The electrically conductive shield is configured to be electrically grounded within the plasma processing chamber and includes a tube-shaped portion being disposed outside of the annular dielectric body and surrounding at least part of the annular dielectric body. The electrically conductive shield further includes an inwardly-protruding flange portion being in electrical contact with the tube-shaped portion. The flange portion forms a plane that intersects the tube-shaped portion. The flange portion is embedded within the annular dielectric body.

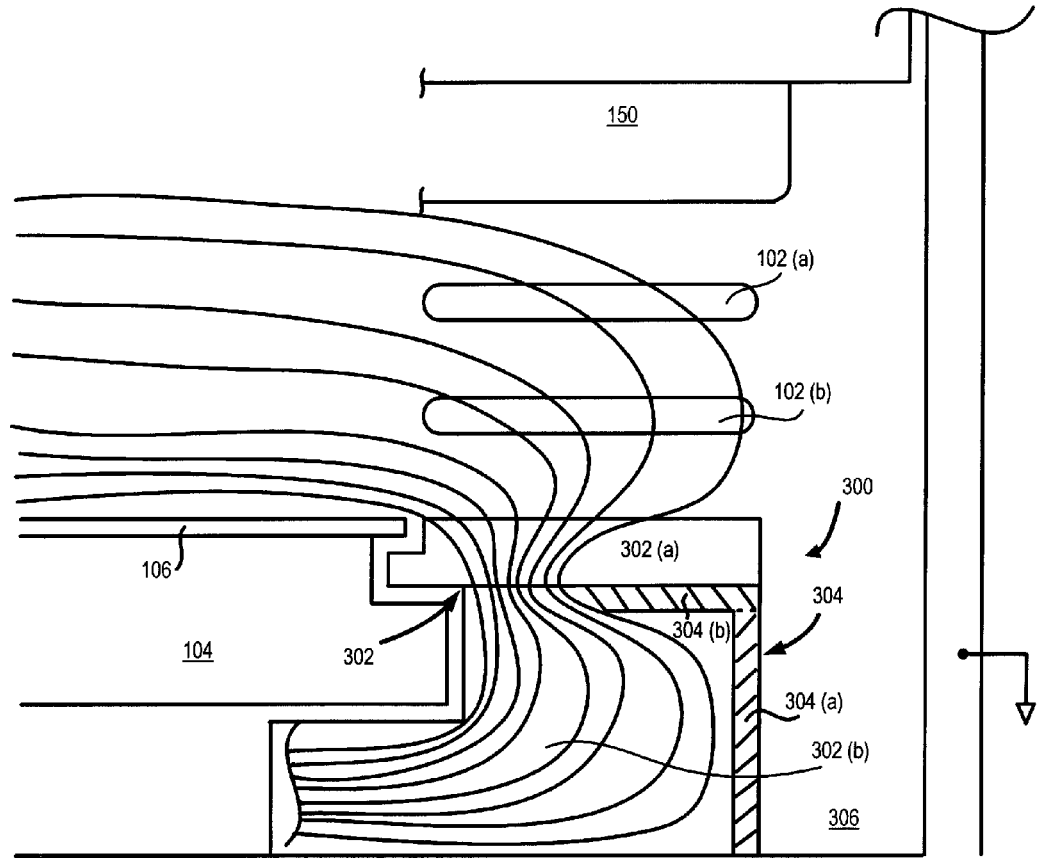

US 5,998,932 C1

EX PARTE
REEXAMINATION CERTIFICATE
ISSUED UNDER 35 U.S.C. 307

THE PATENT IS HEREBY AMENDED AS
INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claim 6 is cancelled.

Claims 1, 4, 5, 8, 11, 12, 16, 19, 20 and 21 are determined to be patentable as amended.

Claims 2, 3, 7, 9, 10, 13-15, 17-18 and 22, dependent on an amended claim, are determined to be patentable.

New claims 23-50 are added and determined to be patentable.

1. A focus ring assembly configured to substantially encircle a chuck of a plasma processing chamber, *the focus ring assembly, during processing, is configured to improve process uniformity across an entire surface of a substrate when present on the chuck, such that equipotential field lines are to be disposed substantially uniformly over the entire surface of the substrate*, comprising:
   an annular dielectric body; and
   an electrically conductive shield surrounding said annular dielectric body, said electrically conductive shield being configured to be electrically grounded within said plasma processing chamber, said electrically conductive shield including
      a tube-shaped portion being disposed outside of said annular dielectric body and surrounding at least part of said annular dielectric body, and
      an inwardly-protruding flange portion being in electrical contact with said tube-shaped portion, said flange portion forming a plane that intersects said tube-shaped portion, said flange portion being embedded within said annular dielectric body.

4. A focus ring assembly configured to substantially encircle a chuck of a plasma processing chamber, *the focus ring assembly, during processing, is configured to improve process uniformity across an entire surface of a substrate when present on the chuck, such that equipotential field lines are to be disposed substantially uniformly over the entire surface of the substrate*, comprising:
   an annular dielectric body; and
   an electrically conductive shield surrounding said annular dielectric body, said electrically conductive shield being configured to be electrically grounded within said plasma processing chamber, said electrically conductive shield including
      a tube-shaped portion being disposed outside of said annular dielectric body and surrounding at least part of said annular dielectric body, and
      an inwardly-protruding flange portion being in electrical contact with said tube-shaped portion, said flange portion forming a plane that intersects said tube-shaped portion, said flange portion being embedded within said annular dielectric body,
   wherein said annular dielectric body is formed of a first annular portion and a second annular portion adjacent said first annular portion, at least a portion of said second annular portion being surrounded by said tube-shaped portion of said electrically conductive shield, said first annular portion is formed of a first dielectric material *that is a separate body of quartz*, said second annular portion is formed of a second dielectric material different from said first dielectric material.

5. The focus ring assembly of claim 4 wherein said first dielectric material has a first dielectric constant, said second dielectric [constant] *material* has a second dielectric constant closer to a dielectric constant of vacuum than said first dielectric constant.

8. A plasma processing chamber configured to process a substrate, comprising:
   a chuck configured to support said substrate during plasma processing; and
   a focus ring assembly substantially encircling said chuck, said focus ring assembly including:
      an annular dielectric body; and
      an electrically conductive shield surrounding said annular dielectric body, said electrically conductive shield being configured to be electrically grounded within said plasma processing chamber, said electrically conductive shield including
         a tube-shaped portion being disposed outside of said annular dielectric body and surrounding at least part of said annular dielectric body, and
         an inwardly-protruding flange portion being in electrical contact with said tube-shaped portion, said flange portion forming a plane that intersects said tube-shaped portion, said flange portion [being] embedded *and extending* within said annular dielectric body *a distance that is approximately halfway between the tube-shaped portion and the chuck to enable equipotential field lines to be disposed substantially uniformly over of the substrate during processing*.

11. A plasma processing chamber configured to process a substrate, comprising:
   a chuck configured to support said substrate during plasma processing; and
   a focus ring assembly substantially encircling said chuck, said focus ring assembly including:
      an annular dielectric body; and
      an electrically conductive shield surrounding said annular dielectric body, said electrically conductive shield being configured to be electrically grounded within said plasma processing chamber, said electrically conductive shield including
         a tube-shaped portion being disposed outside of said annular dielectric body and surrounding at least part of said annular dielectric body, and
         an inwardly-protruding flange portion being in electrical contact with said tube-shaped portion, said flange portion forming a plane that intersects said tube-shaped portion, said flange portion being embedded within said annular dielectric body *to a depth of penetration that is approximately halfway between the tube-shaped portion and the chuck*,
   wherein said annular dielectric body is formed of a first annular portion and a second annular portion adjacent said first annular portion, at least a portion of said second annular portion being surrounded by said tube-shaped portion of said electrically conductive shield, said first annular portion is formed of a first dielectric material, said second annular portion is formed of a second dielectric material different from said first dielectric material.

12. The plasma processing chamber of claim 11 wherein said first dielectric material has a first dielectric constant, said second dielectric [constant] *material* has a second dielectric constant closer to a dielectric constant of vacuum than said first dielectric constant.

16. A method for forming a focus ring assembly of a plasma processing chamber, said focus ring assembly being configured to substantially encircle a chuck of said plasma processing chamber, comprising:
providing an annular dielectric body *by placing a top surface of the annular dielectric body to be approximately coplanar with a top surface of a substrate when present on the chuck*; and
surrounding said annular dielectric body with an electrically conductive shield, including surrounding at least part of said annular dielectric body with a tube-shaped portion of said electrically conductive shield, said tube-shaped portion being disposed outside of said annular dielectric body, and
embedding an inwardly-protruding flange portion of said electrically conductive shield within said annular dielectric body *to a depth of penetration that is approximately halfway between the tube-shaped portion and the chuck*, said inwardly-protruding flange portion being in electrical contact with said tube-shaped portion, said flange portion forming a plane that intersects said tube-shaped portion.

19. A method for forming a focus ring assembly of a plasma processing chamber, said focus ring assembly being configured to substantially encircle a chuck of said plasma processing chamber, comprising:
providing an annular dielectric body; and
surrounding said annular dielectric body with an electrically conductive shield, including
surrounding at least part of said annular dielectric body with a tube-shaped portion of said electrically conductive shield, said tube-shaped portion being disposed outside of said annular dielectric body, and
embedding an inwardly-protruding flange portion of said electrically conductive shield within said annular dielectric body *to a depth of penetration that is approximately halfway between the tube-shaped portion and the chuck*, said inwardly-protruding flange portion being in electrical contact with said tube-shaped portion, said flange portion forming a plane that intersects said tube-shaped portion,
wherein said annular dielectric body is formed of a first annular portion and a second annular portion adjacent said first annular portion, at least a portion of said second annular portion being surrounded by said tube-shaped portion of said electrically conductive shield, said first annular portion is formed of a first dielectric material, said second annular portion is formed of a second dielectric material different from said first dielectric material.

20. The method of claim 19 wherein said first dielectric material has a first dielectric constant, said second dielectric [constant] *material* has a second dielectric constant closer to a dielectric constant of vacuum than said first dielectric constant.

21. The method of claim 20 wherein said first dielectric material is [ceramic] *a separate body of quartz*.

23. *A focus ring assembly configured to substantially encircle a chuck of a plasma processing chamber, comprising:*
*an annular dielectric body; and*
*an electrically conductive shield surrounding said annular dielectric body, said electrically conductive shield being configured to be electrically grounded within said plasma processing chamber, said electrically conductive shield including*
*a tube-shaped portion being disposed outside of said annular dielectric body and surrounding at least part of said annular dielectric body, and*
*an inwardly-protruding flange portion being in electrical contact with said tube-shaped portion, said flange portion forming a plane that intersects said tube-shaped portion, said flange portion being embedded within said annular dielectric body, such that a top surface of the annular dielectric body is approximately coplanar with a top surface of a substrate when present on the chuck.*

24. *The focus ring assembly of claim 23, wherein said inwardly-protruding flange portion is embedded and extending within said annular dielectric body a distance that is approximately halfway between the tube-shaped portion and the chuck.*

25. *The focus ring assembly of claim 23, wherein the inwardly-protruding flange portion is embedded a distance in the annular dielectric body that allows equipotential field lines to be disposed substantially uniformly over of a substrate during processing.*

26. *The focus ring assembly of claim 23, wherein a top surface of said inwardly-protruding flange portion is positioned at a level below a supporting surface of the chuck.*

27. *The focus ring assembly of claim 23, wherein said inwardly-protruding flange portion is embedded and extending within said annular dielectric body a distance that is approximately halfway between the tube-shaped portion and the chuck, wherein a top surface of said inwardly-protruding flange portion is positioned at a level below a supporting surface of the chuck.*

28. *The focus ring assembly of claim 4, wherein a top surface of the annular dielectric body is approximately coplanar with a top surface of a substrate when present on the chuck.*

29. *The focus ring assembly of claim 23, wherein the plasma processing chamber operates to process one or more etching operations on substrates to make integrated circuits.*

30. *The focus ring assembly of claim 4, wherein the inwardly-protruding flange portion is embedded a distance in the annular dielectric body that allows equipotential field lines to be disposed substantially uniformly over a substrate during processing.*

31. *The focus ring assembly of claim 4, wherein a top surface of said inwardly-protruding flange portion is positioned at a level below a supporting surface of the chuck.*

32. *The focus ring assembly of claim 4, wherein the first annular portion and the second annular portion are not molded to the electrically conductive shield.*

33. *The plasma processing chamber of claim 8, wherein a top surface of the annular dielectric body is approximately coplanar with a top surface of a substrate when present on the chuck.*

34. *The plasma processing chamber of claim 8, wherein a top surface of said inwardly-protruding flange portion is positioned at a level below a supporting surface of the chuck.*

35. *The plasma processing chamber of claim 11, wherein that a top surface of the annular dielectric body is approximately coplanar with a top surface of a substrate when present on the chuck, wherein a top surface of said inwardly-* protruding flange portion is positioned at a level below a supporting surface of the chuck.

36. The plasma processing chamber of claim 11, wherein the inwardly-protruding flange portion is embedded a distance in the annular dielectric body that allows equipotential field lines to be disposed substantially uniformly over a substrate during processing.

37. The focus ring assembly of claim 11, wherein the first annular portion and the second annular portion are not molded to the electrically conductive shield.

38. The method of claim 16, wherein embedding the inwardly-protruding flange portion further includes:
    placing a top surface of said inwardly-protruding flange portion to be at a level below the top surface of the chuck that allows equipotential field lines to be disposed substantially uniformly over a substrate during processing to make integrated circuit devices during method processing operations executed by the plasma processing chamber when in operation.

39. The method of claim 19, wherein embedding the inwardly-protruding flange portion further includes:
    placing a top surface of said inwardly-protruding flange portion to be at a level below the top surface of the chuck that allows equipotential field lines to be disposed substantially uniformly over a substrate during processing.

40. The method of claim 19, wherein the first annular portion and the second annular portion are not molded to the electrically conductive shield.

41. A focus ring assembly configured to substantially encircle a chuck of a plasma processing chamber, comprising:
    an annular dielectric body; and
    an electrically conductive shield surrounding said annular dielectric body, said electrically conductive shield being configured to be electrically grounded within said plasma processing chamber, said electrically conductive shield including
        a tube-shaped portion being disposed outside of said annular dielectric body and surrounding at least part of said annular dielectric body, and
        an inwardly-protruding flange portion being in electrical contact with said tube-shaped portion, said flange portion forming a plane that intersects said tube-shaped portion, said flange portion being embedded within said annular dielectric body to a depth of penetration that is approximately halfway between the tube-shaped portion and the chuck.

42. A focus ring assembly configured to substantially encircle a chuck of a plasma processing chamber, comprising:
    the chuck having a supporting surface for a substrate;
    an annular dielectric body being a composite structure having a first annular portion and a second annular portion separate from the first annular portion, wherein a top surface of the annular dielectric body is approximately coplanar with a top surface of a substrate when present on the chuck; and
    an electrically conductive shield surrounding said annular dielectric body, said electrically conductive shield being configured to be electrically grounded within said plasma processing chamber, said electrically conductive shield including
        a tube-shaped portion being disposed outside of said annular dielectric body and surrounding at least part of said annular dielectric body, and
        an inwardly-protruding flange portion being in electrical contact with said tube-shaped portion, said flange portion forming a plane that intersects said tube-shaped portion and a top surface of said inwardly-protruding flange portion is positioned at a level below the supporting surface of the chuck, said flange portion being embedded within said annular dielectric body to a depth of penetration that is approximately halfway between the tube-shaped portion and the chuck, such that a complete first annular portion of the composite structure is disposed above the inwardly-protruding flange portion.

43. The focus ring assembly of claim 42, wherein the first annular portion and the second annular portion are not molded to the electrically conductive shield.

44. The focus ring assembly of claim 42, wherein said plane intersects said tube-shaped portion at an upper edge of said tube-shaped portion, said upper edge of said tube-shaped portion being positioned in between an upper surface of said annular dielectric body and a lower surface of said annular dielectric body.

45. A plasma processing chamber configured to process a substrate, comprising:
    a chuck configured to support said substrate during plasma processing; and
    a focus ring assembly substantially encircling said chuck, said focus ring assembly including:
        an annular dielectric body; and
        an electrically conductive shield surrounding said annular dielectric body, said electrically conductive shield being configured to be electrically grounded within said plasma processing chamber, said electrically conductive shield including
            a tube-shaped portion being disposed outside of said annular dielectric body and surrounding at least part of said annular dielectric body, and
            an inwardly-protruding flange portion being in electrical contact with said tube-shaped portion, said flange portion forming a plane that intersects said tube-shaped portion and a top surface of said inwardly-protruding flange portion is positioned at a level below the supporting surface of the chuck, said flange portion embedded within said annular dielectric body.

46. The plasma processing chamber of claim 45, wherein a top surface of the annular dielectric body is approximately coplanar with a top surface of a substrate when present on the chuck.

47. The plasma processing chamber of claim 45, wherein the annular dielectric body is a composite structure having a first annular portion and a second annular portion separate from the first annular portion, and wherein a complete first annular portion of the composite structure is disposed above the inwardly-protruding flange portion.

48. A plasma processing chamber configured to process a substrate, comprising:
    a chuck configured to support said substrate during plasma processing; and
    a focus ring assembly substantially encircling said chuck, said focus ring assembly including:
        an annular dielectric body formed of a first annular portion and a second annular portion adjacent said first annular portion; and
        an electrically conductive shield surrounding said annular dielectric body, said electrically conductive shield being configured to be electrically grounded within said plasma processing chamber, said electrically conductive shield including
  a tube-shaped portion being disposed outside of said annular dielectric body and surrounding at least part of said annular dielectric body, and
  an inwardly-protruding flange portion being in electrical contact with said tube-shaped portion, said flange portion forming a plane that intersects said tube-shaped portion and a top surface of said inwardly-protruding flange portion is positioned at a level below the supporting surface of the chuck, said flange portion embedded within said annular dielectric body enabling equipotential field lines to be disposed substantially uniformly over of the substrate during processing, wherein said first annular portion and said second annular portion are not molded to the electrically conductive shield.

*49.* The plasma processing chamber of claim 48, wherein the second annular portion is separate from the first annular portion, and wherein a complete first annular portion is disposed above the inwardly-protruding flange portion.

*50.* The plasma processing chamber of claim 45, wherein the plasma processing chamber operates to perform one or more etching operations used to make an integrated circuit.

* * * * *